United States Patent
Masui et al.

(10) Patent No.: US 11,973,069 B2
(45) Date of Patent: Apr. 30, 2024

(54) FABRICATION OF LED ARRAYS AND LED ARRAY LIGHT ENGINES

(71) Applicant: LUMILEDS LLC, San Jose, CA (US)

(72) Inventors: Hisashi Masui, San Jose, CA (US); Franklin Chiang, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/849,168

(22) Filed: Jun. 24, 2022

(65) Prior Publication Data
US 2022/0415863 A1 Dec. 29, 2022

Related U.S. Application Data

(60) Provisional application No. 63/215,361, filed on Jun. 25, 2021.

(51) Int. Cl.
H01L 25/075 (2006.01)
F21V 5/04 (2006.01)
H01L 33/60 (2010.01)

(52) U.S. Cl.
CPC ............ *H01L 25/0753* (2013.01); *F21V 5/04* (2013.01); *H01L 33/60* (2013.01); *H01L 2933/0058* (2013.01)

(58) Field of Classification Search
CPC ... H01L 25/0753; H01L 33/60; H01L 27/156; F21V 5/04; F21K 9/68
See application file for complete search history.

(56) References Cited

U.S. PATENT DOCUMENTS

| | | | | |
|---|---|---|---|---|
| 7,210,806 B2* | 5/2007 | Holman | ................. | G02B 5/045 |
| | | | | 257/E33.072 |
| 2005/0274967 A1* | 12/2005 | Martin | ................... | C09K 11/02 |
| | | | | 257/98 |
| 2006/0284207 A1* | 12/2006 | Park | ........................ | H01L 24/97 |
| | | | | 257/E33.072 |
| 2008/0179613 A1* | 7/2008 | Wendt | ...................... | G02B 1/02 |
| | | | | 216/2 |

(Continued)

FOREIGN PATENT DOCUMENTS

EP 3340321 A1 6/2018

OTHER PUBLICATIONS

From the EPO as the ISA, Notification of Transmittal of the International Search Report and the Written Opinion of the International Searching Authority, or the Declarations, PCT/US2022/034960, Sep. 27, 2022, 11 pages.

*Primary Examiner* — Tracie Y Green
*Assistant Examiner* — Michael Chiang

(57) ABSTRACT

This specification discloses LED arrays comprising a grid structure that physically and optically isolates adjacent LEDs or groups of LEDs in the array from each other. The grid structure comprises an arrangement of walls defining cells. Individual LEDs or groups of LEDs in the array are positioned within different ones of the cells, separated from adjacent LEDs or groups of LEDs by the grid walls. This specification also discloses fabrication processes for such LED arrays. In these fabrication processes, the grid structure is formed as a separate monolithic structure. The LEDs or pcLEDs are arranged on and attached to a substrate (for example, a printed circuit board), after which the grid structure is attached to the substrate in registry with the arrangement of LEDs or pcLEDs.

20 Claims, 11 Drawing Sheets

(56) References Cited

U.S. PATENT DOCUMENTS

| | | | |
|---|---|---|---|
| 2011/0018017 A1 | 1/2011 | Bierhuizen et al. | |
| 2012/0147589 A1* | 6/2012 | Farmer | F21V 7/04 |
| | | | 362/235 |
| 2014/0003044 A1* | 1/2014 | Harbers | H01L 33/60 |
| | | | 362/230 |
| 2015/0003056 A1* | 1/2015 | Choi | F21V 13/14 |
| | | | 362/342 |
| 2020/0212101 A1 | 7/2020 | Masui et al. | |
| 2020/0212270 A1* | 7/2020 | Bohmer | H01L 33/507 |
| 2020/0243729 A1* | 7/2020 | Bohmer | H01L 27/156 |
| 2021/0367121 A1* | 11/2021 | Kim | H01L 27/156 |
| 2022/0140184 A1* | 5/2022 | Zeng | H01L 25/0753 |
| | | | 257/79 |

* cited by examiner

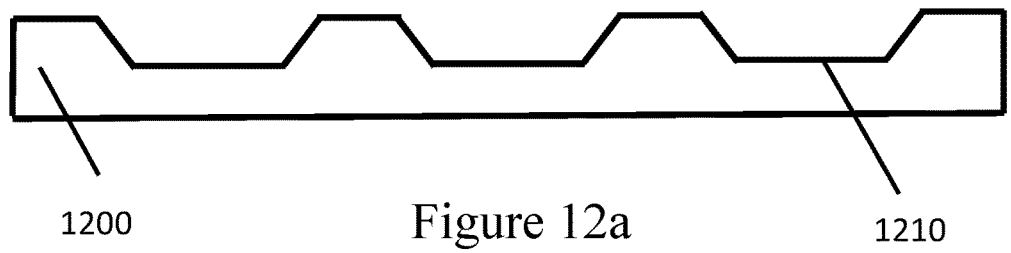
1200   Figure 12a   1210
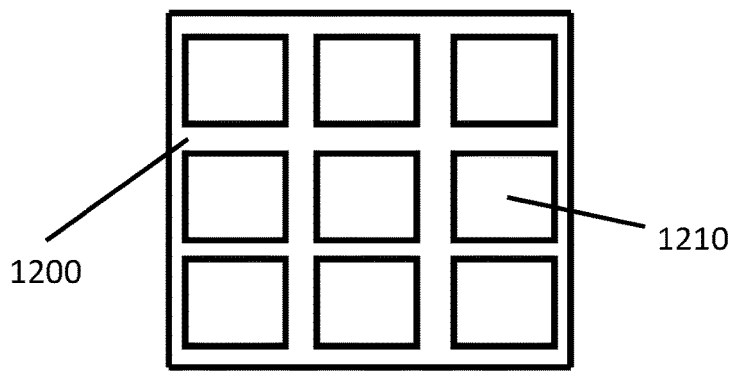
1200   Figure 12b   1210
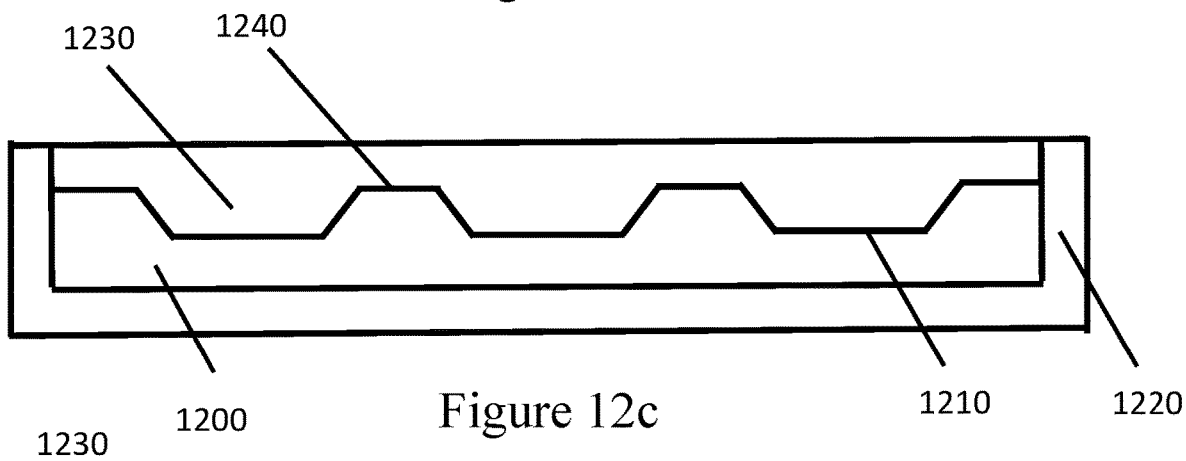
1200   Figure 12c   1210   1220
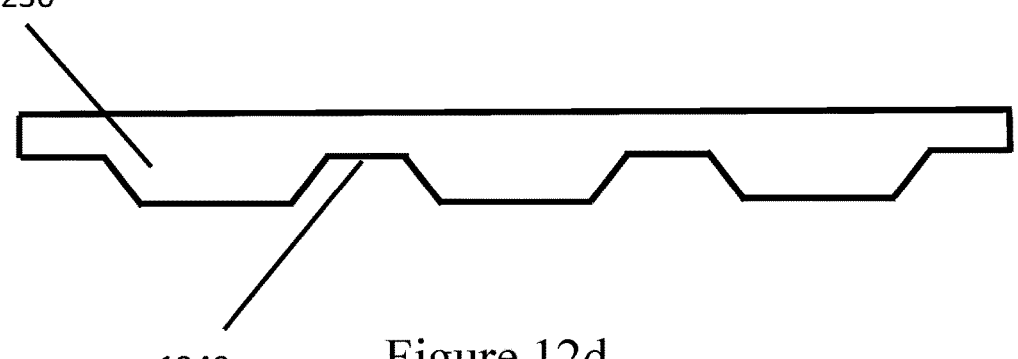
1240   Figure 12d

FABRICATION OF LED ARRAYS AND LED ARRAY LIGHT ENGINES

CROSS REFERENCE TO RELATED APPLICATIONS

This application claims priority to U.S. Provisional Patent Application 63/215,361 titled "Fabrication of LED Arrays and LED Array Light Engines" filed Jun. 25, 2021, which is incorporated herein by reference in its entirety.

FIELD OF THE INVENTION

The invention relates generally to arrays of light emitting diodes, light engines comprising such arrays, and methods for fabricating such arrays and light engines.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer. Phosphor-converted LEDs may be designed so that all the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Such LEDs and pcLEDs may be arranged in arrays for use, for example, in displays, interior and exterior general illumination (e.g. in buildings and houses), interior and exterior automotive illumination (e.g., headlights and other exterior automotive illumination), and light engines for such applications. This specification uses the term LED array to include arrays of LEDs, pcLEDs, or combinations of LEDs and pcLEDs. A light engine generally includes an LED array mounted, for example on a printed circuit board, in a manner that provides electrical and mechanical fixings for the array making it ready to be fixed in place in an application (e.g., a luminaire).

SUMMARY

This specification discloses LED arrays comprising a grid structure that physically and optically isolates adjacent LEDs or groups of LEDs in the array from each other. The grid structure comprises an arrangement of walls defining cells or openings. Individual LEDs or groups of LEDs in the array are positioned within different ones of the cells, separated from adjacent LEDs or groups of LEDs by the grid walls. The grid structure may reduce cross-talk (light leakage) between adjacent pixels in the array and improve contrast between adjacent pixels.

This specification also discloses fabrication processes for such LED arrays. In these fabrication processes, the grid structure is formed as a separate monolithic structure. The LEDs or pcLEDs are arranged on and attached to a substrate (for example, a printed circuit board), after which the grid structure is attached to the substrate in registry with the arrangement of LEDs or pcLEDs to optically and physically isolate them as described above.

The LED arrays disclosed herein may be advantageously employed in, for example, any of the devices and applications listed above in the Background section or below.

Other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIG. 7a illustrates a cross-sectional view with the sidewalls facing up to have a larger light emitting opening at the top of the cell than at the bottom of the cell, and FIG. 7b illustrates a top view of that grid. FIG. 7c illustrates a cross-sectional view with the sidewalls facing down towards the substrate to have a narrower light emitting opening at the top of the cell than at the bottom of the cell.

FIG. 8a illustrates a perspective view of the wafer with a mask and the resulting plate with the etched cell. FIG. 8b illustrates a cross sectional view of the etched cell.

FIGS. 12a-12d illustrate a process of using a casting mold to form a monolithic grid.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
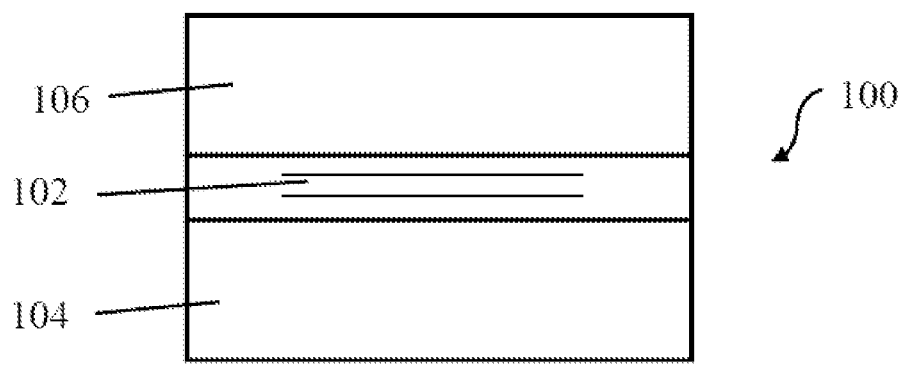
FIG. 1 shows a schematic cross-sectional view of an example pcLED.

FIG. 1 shows an example of an individual pcLED 100 comprising a light emitting semiconductor diode structure 102 disposed on a substrate 104, and a phosphor layer 106 disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
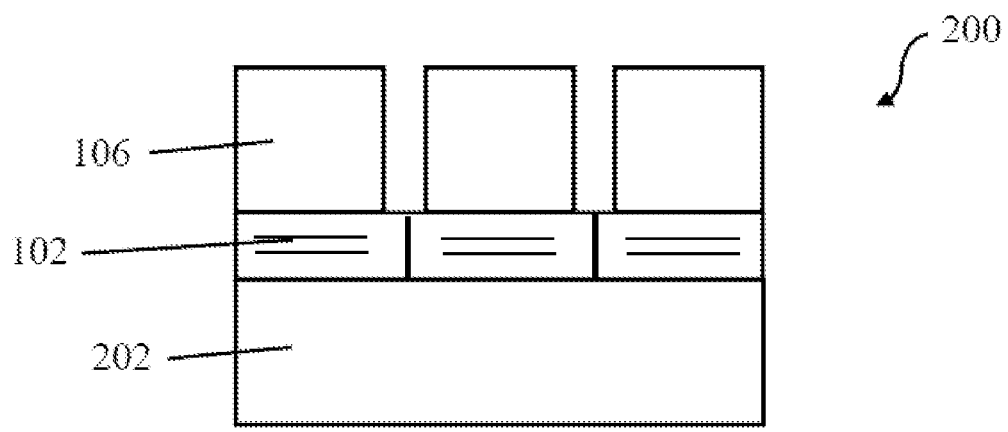
FIGS. 2A and 2B show, respectively, cross-sectional and top schematic views of an array of pcLEDs.
Figure 2B:
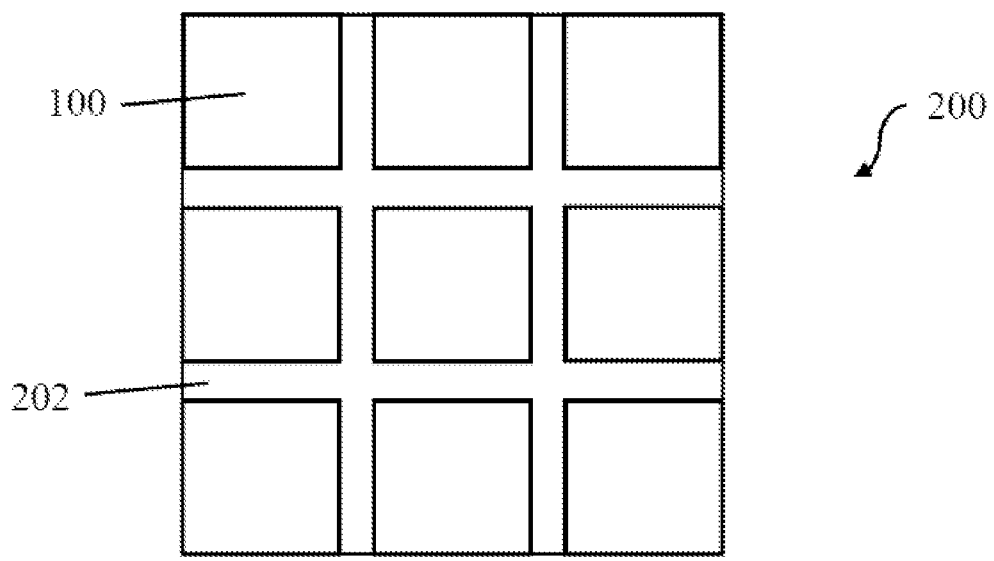

FIGS. 2A-2B show, respectively, cross-sectional and top views of an array 200 of pcLEDs 100 including phosphor pixels 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable materials.

Although FIGS. 2A-2B, show a three-by-three array of nine pcLEDs, such arrays may include for example tens, hundreds, or any suitable number of LEDs. Individual LEDs (pixels) may have widths (e.g., side lengths) in the plane of the array of, for example, less than or equal to 1 millimeter (mm), less than or equal to 500 microns, or less than or equal to 100 microns. LEDs in such an array may be spaced apart from each other by streets or lanes having a width in the plane of the array of, for example, greater than a millimeter, less than or equal to a millimeter, or less than or equal to 500 microns. Although the illustrated examples show rectangular pixels arranged in a symmetric matrix, the pixels and the array may have any suitable shape.

The individual LEDs in an LED array may be individually addressable, may be addressable as part of a group or subset of the pixels in the array, or may not be addressable. Thus, light emitting diode arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. Such light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Figure 3A:
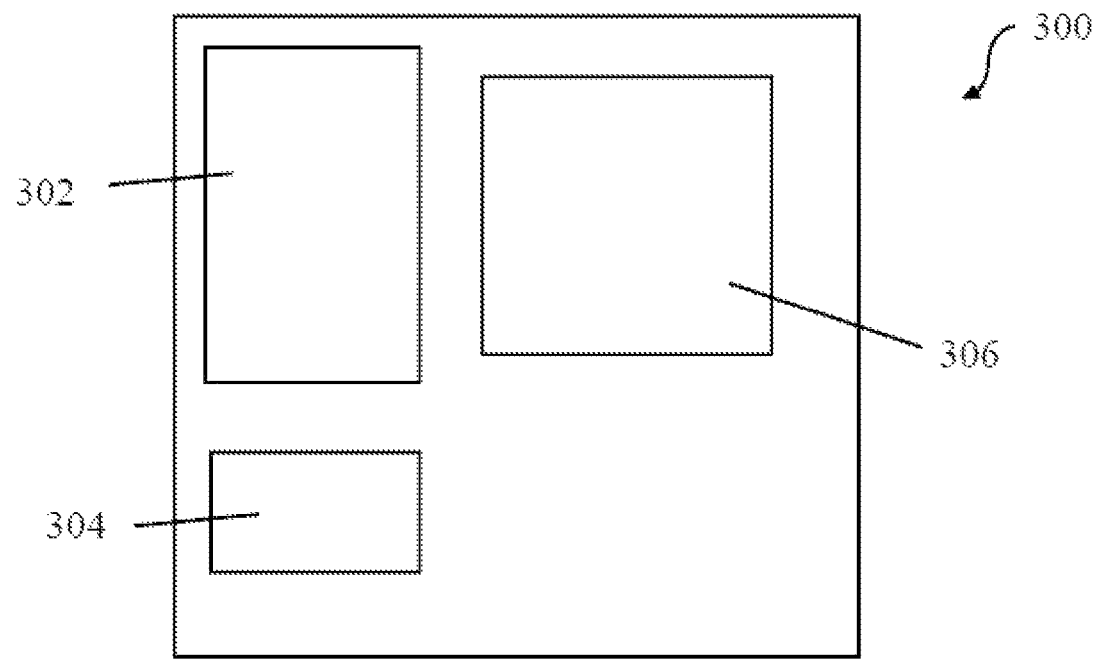
FIG. 3A shows a schematic top view of an electronics board on which an array of pcLEDs may be mounted, and FIG. 3B similarly shows an array of pcLEDs mounted on the electronic board of FIG. 3A.
Figure 3B:
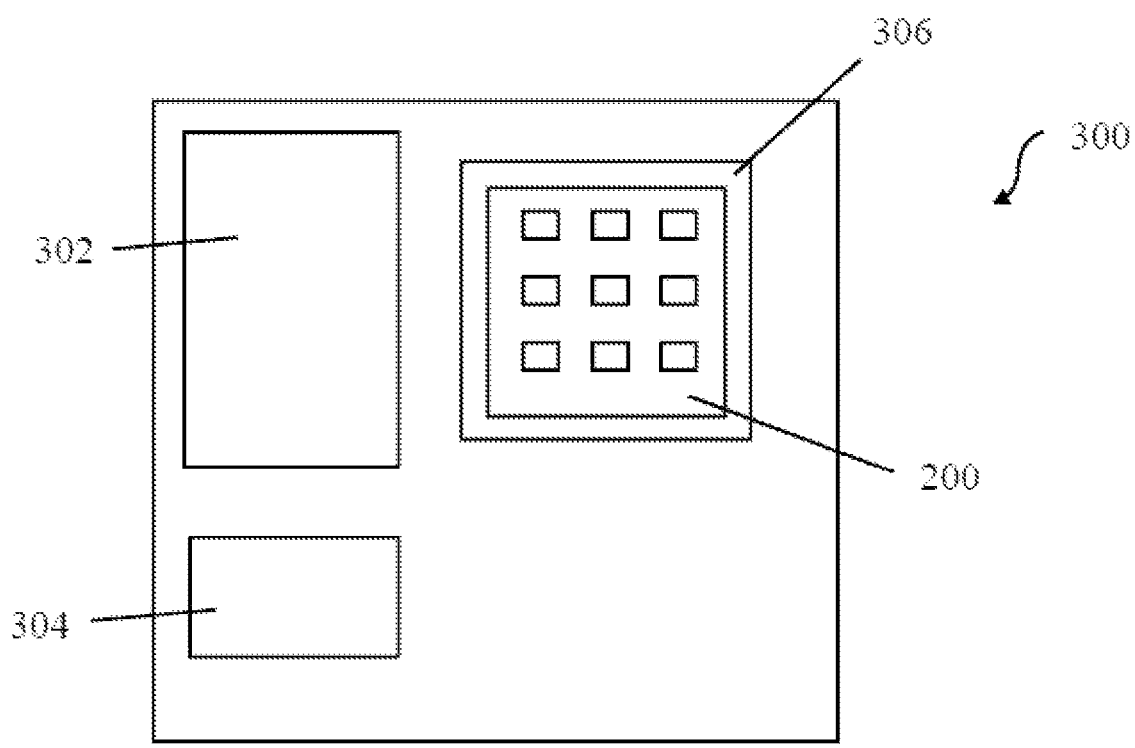

As shown in FIGS. 3A-3B, an LED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, LED array 200 may be mounted on a separate board (not shown) from the power and control module and the sensor module.

Figure 4A:
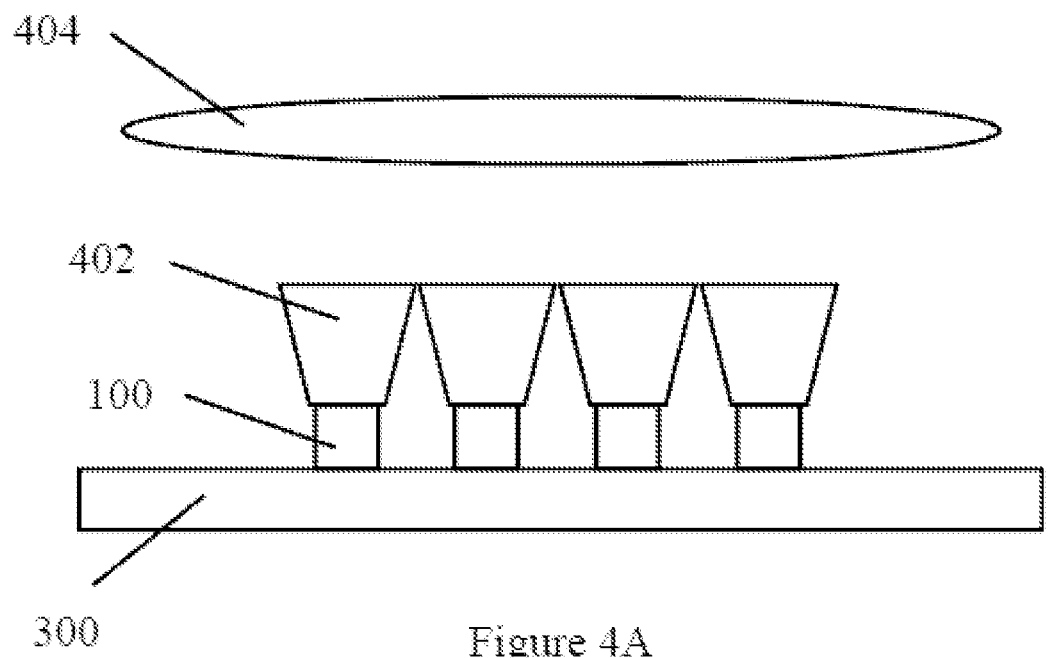
FIG. 4A shows a schematic cross sectional view of an array of pcLEDs arranged with respect to waveguides and a projection lens.
Figure 4B:
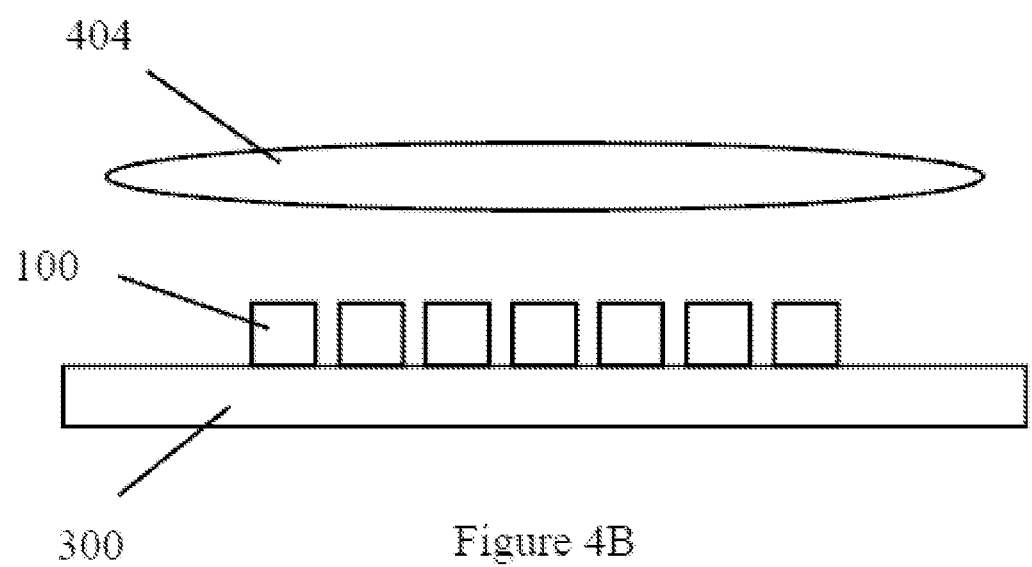
FIG. 4B shows an arrangement similar to that of FIG. 4A, without the waveguides.

Individual LEDs and pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B an LED array 200 (for example, mounted on an electronics board 300) may be arranged in combination with secondary optical elements such as waveguides, lenses, or both for use in an intended application, for example as precollimators. In FIG. 4A, light emitted by pcLEDs 100 is collected by waveguides 402 and directed to projection lens 404. Projection lens 404 may be a Fresnel lens, for example. This arrangement may be suitable for use, for example, in interior automobile illumination, automobile headlights, and other exterior automobile illumination. In FIG. 4B, light emitted by pcLEDs 100 is collected directly by projection lens 404 without use of intervening waveguides. This arrangement may particularly be suitable when the LEDs or pcLEDs can be spaced sufficiently close to each other. Generally, any suitable arrangement of optical elements may be used in combination with the LED arrays described herein, depending on the desired application.

An array of independently operable LEDs may be used in combination with a lens, lens system, or other optical system (e.g., as described above) to provide illumination that is adaptable for a particular purpose. For example, in operation such an adaptive lighting system may provide illumination that varies by color and/or intensity across an illuminated scene or object and/or is aimed in a desired direction. A controller can be configured to receive data indicating locations and color characteristics of objects or persons in a scene and based on that information control LEDs in an LED array to provide illumination adapted to the scene. Such data can be provided for example by an image sensor, or optical (e.g. laser scanning) or non-optical (e.g. millimeter radar) sensors. Such adaptive illumination is increasingly important for automotive and illumination applications.

Figure 5:
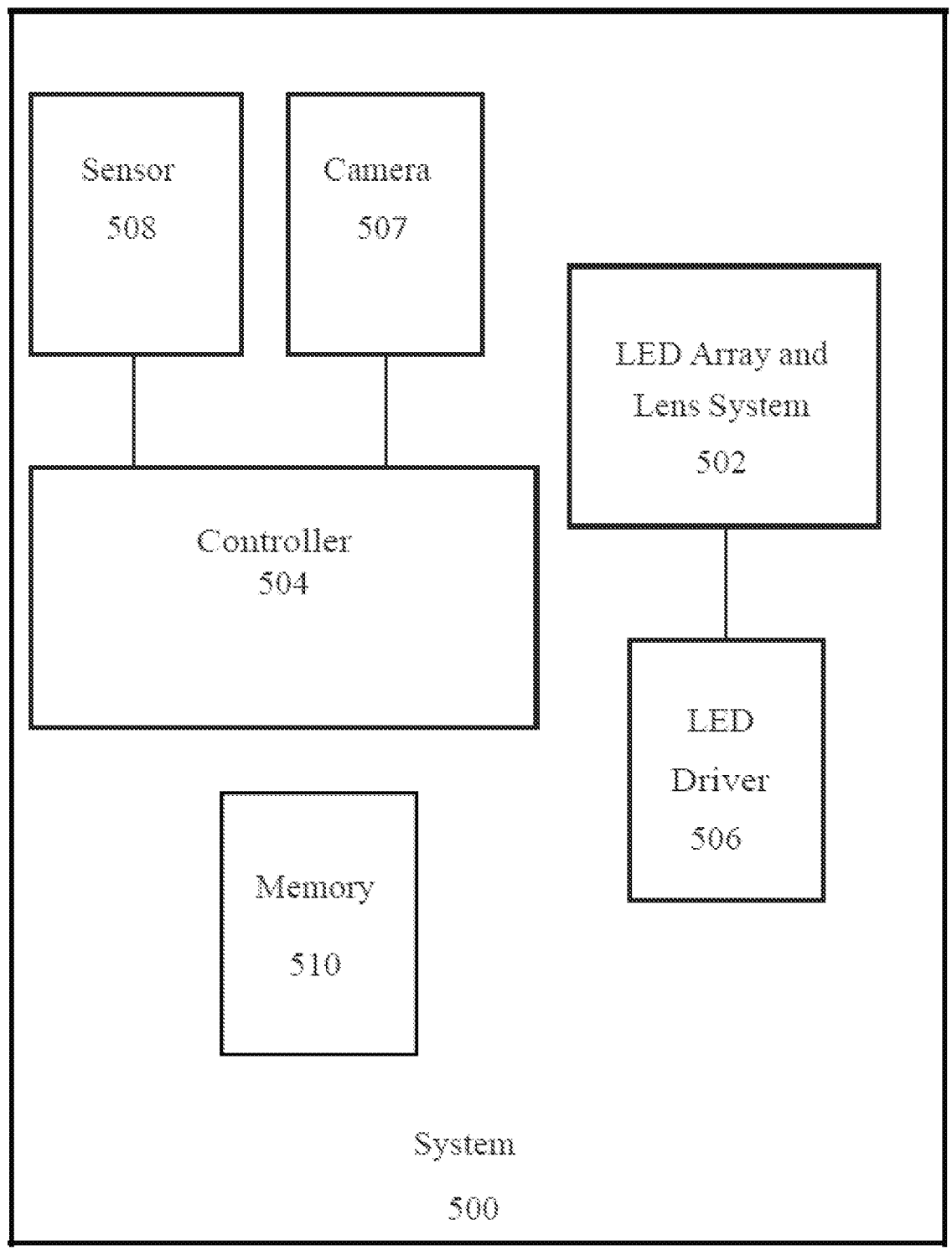
FIG. 5 schematically illustrates an example camera flash system comprising an adaptive illumination system.

FIG. 5 schematically illustrates an example camera flash system 500 comprising an LED array and lens system 502, which may be similar or identical to the systems described above. Flash system 500 also comprises an LED driver 506 that is controlled by a controller 504, such as a microprocessor. Controller 504 may also be coupled to a camera 507 and to sensors 508, and operate in accordance with instructions and profiles stored in memory 510. Camera 507 and adaptive illumination system 502 may be controlled by controller 504 to match their fields of view.

Sensors 508 may include, for example, positional sensors (e.g., a gyroscope and/or accelerometer) and/or other sensors that may be used to determine the position, speed, and orientation of system 500. The signals from the sensors 508 may be supplied to the controller 504 to be used to determine the appropriate course of action of the controller 504 (e.g., which LEDs are currently illuminating a target and which LEDs will be illuminating the target a predetermined amount of time later).

In operation, illumination from some or all pixels of the LED array in 502 may be adjusted—deactivated, operated at full intensity, or operated at an intermediate intensity. Beam focus or steering of light emitted by the LED array in 502 can be performed electronically by activating one or more subsets of the pixels, to permit dynamic adjustment of the beam shape without moving optics or changing the focus of the lens in the lighting apparatus.

As summarized above, this specification discloses LED arrays comprising a grid structure that physically and optically isolates adjacent LEDs or groups of LEDs in the array from each other, and methods of making such arrays.

Figure 6:
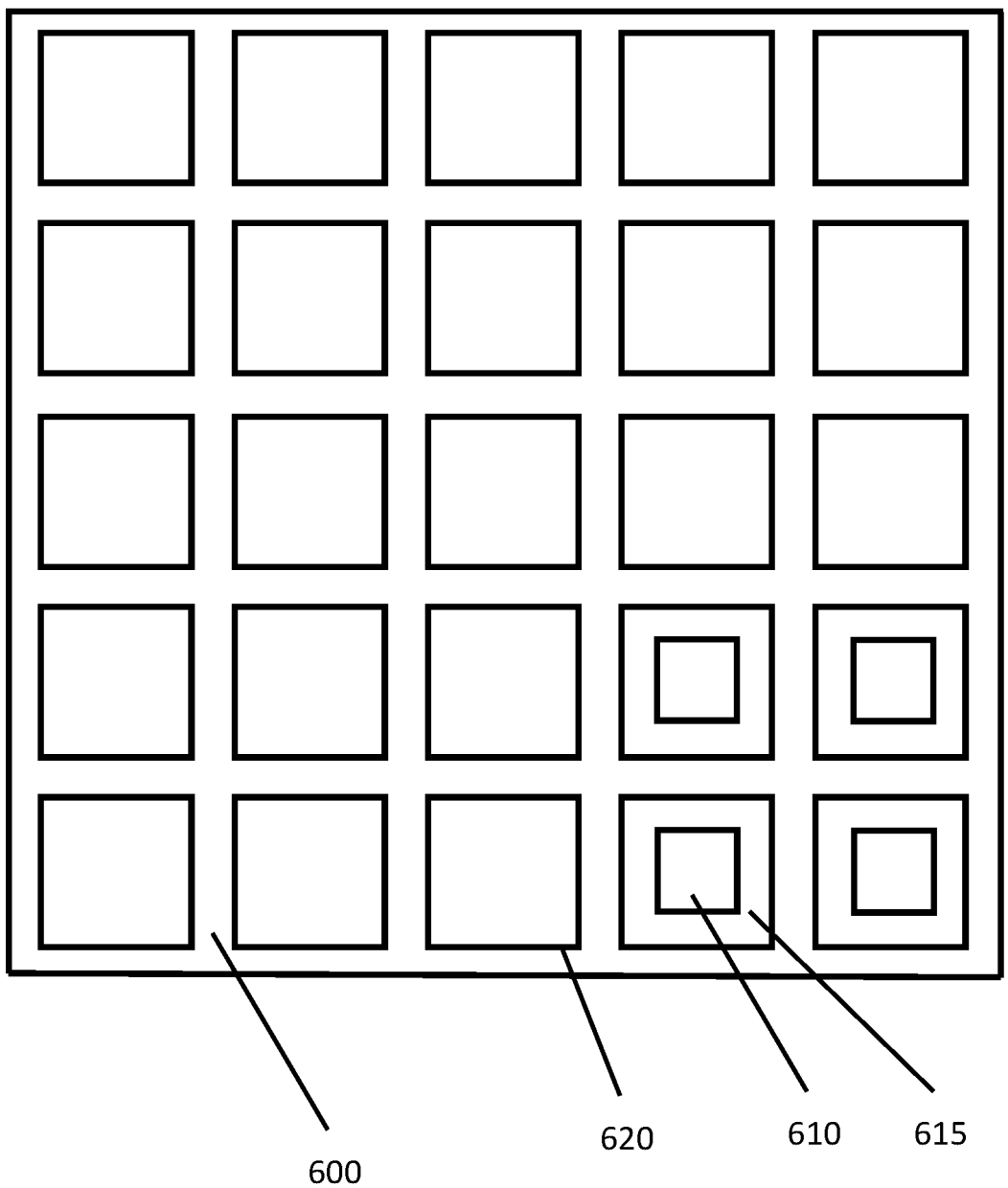
FIG. 6 illustrates a top view of a monolithic grid disposed on a substrate with an array of LEDs.

FIG. 6 shows an example of a light emitting array with a grid 600, LED dies 610, and substrate 615. The die 610 are disposed on the substrate 615 in an array. The array structure may be, for example, a 2×2, 3×3, 5×5, or 10×10 arrangement of LED dice, or only be from 5×5 to 15×15, or any other suitable arrangement. The substrate may be a printed circuit board, and can be a tile (e.g. 4"×4") to facilitate manufacturability. The die may each be discrete die, e.g., each a single semiconductor diode individually mounted on the substrate rather than a monolithic segmented array of LEDs. The die may be, for example, chip scale packaging (CSP) flip chips, or lateral dies with wire bond electrical connections. The die may each have dimensions of about 100×100 microns, 500×500, microns, or any other suitable dimensions. The die may be individually disposed in a cell or opening 620 of the grid and be arranged to emit light from the light emitting surface of the die through the top opening of the cell of the grid. FIG. 6 shows a plan view looking straight on at the light emitting surface of the die in the array. The die may have a smaller area than the area of the cell, for example, less than 80% of the area of the cell, less than 40% of the area of the cell, less than 20% of the area of the cell, or less than 15% of the area of the cell. Other than at the top and bottom of the cell (opposite from and facing the substrate 615, respectively), the die may be surrounded at all sides by the sidewalls of the grid forming the cells 620. The sidewalls of the grid may be reflective. In FIG. 6, the sidewalls of the cell are perpendicular with respect to a plane of the substrate and parallel with the sidewalls of each die. However, the sidewalls of the grid may be non-perpendicular to the substrate upon which it is disposed, as further described below. The sidewalls of the grid may be arranged with any suitable pitch. For example, the pitch may be about 1 mm. The die may be 0.5 mm×0.5 mm located in a 1 mm×1 mm cell, with the grid walls being from 100-200 microns thick, for example form 150-200 microns thick. Alternatively, material different from that of the grid may be disposed on the sidewalls of the grid after it has been formed, in order to provide reflective sidewalls. The grid itself may be a single material or composite of materials, such as silicon, metal, silicone, titanium oxide dispersed in silicone or another polymer, plastic, and/or plastic resins.

Figure 8A:
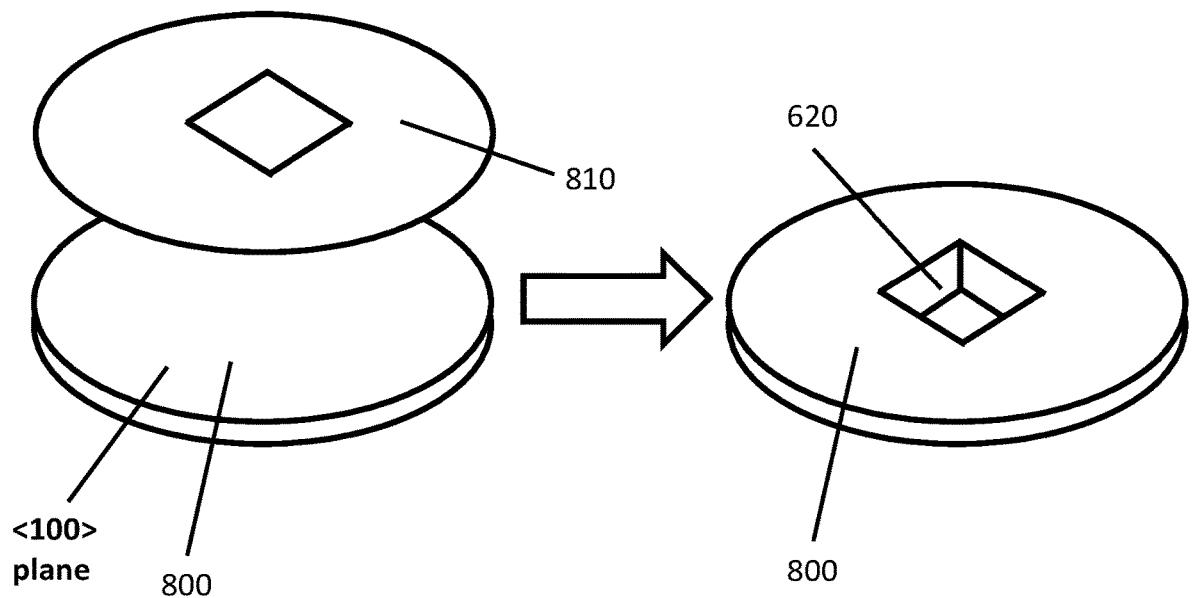
FIGS. 8a-8b illustrate a method of etching a wafer to make the cells in the grid.
Figure 8B:
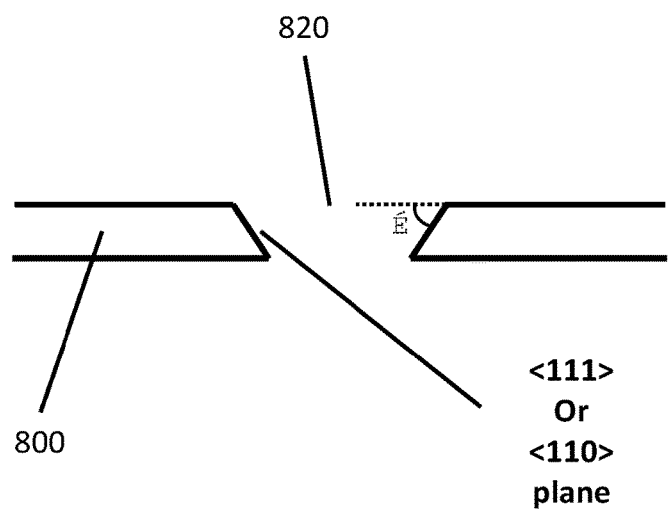

The grid itself may be monolithic, that is, produced as a single or integrated piece. The grid is completely formed and separately formed from the array of die on the substrate before it is placed on the substrate. The production of the grid may depend upon the material used to form it. For example, a silicon grid may be formed by etching square cells in a silicon plate or wafer. The silicon wafer may be a silicon on insulator wafer that includes alternating layer(s) of silicon-insulator-silicon. The etching done on the wafer may be wet etch or dry etch. For example, the silicon may be etched using wet KOH (potassium hydroxide) along <111> or <110> planes, or Bosch Deep Reactive Ion Etching (DRIE) dry etch process. FIG. 8 shows the wet etch using a mask 810 on a wafer 800. The etch is done on the <100> plane to produce cells 620 with angled sidewalls with a non-perpendicular angle α between 50-60°, e.g., 54.7° with respect to a top of the wafer. The sidewalls may be defined by the <111> or <110> planes. In this way, the grid thickness can be arbitrary and easily controlled (tradeoff with array pitch, sidewall, etc.). Alternatively, the grid can be formed using a reflective material via a mold. The grid can be photolithographically patterned TiOx dispersed in silicone.

In another example, an etched silicon grid may be used as casting molds to generate duplicates made of other materials, e.g., white silicone. The casting mold may be generated by, for example, making an array of truncated pyramidal mounts on a silicon wafer by etching, applying white silicone liquid onto the wafer up to the top of the mounds and curing the white silicone to release, as shown in FIGS. 12a-12d. The casting mold 1200 is etched to form trenches 1210. The casting mold 1200 is placed within a holder 1220 with walls to hold in the resin and resin 1230 is poured onto it and into the trenches 1210. The resin 1230 is cured and released from the casting mold 1200 and the holder 1220. The resulting resin 1230 has trenches 1240. These trenches 1240 may be broken through entirely, for example mechanically, so cells puncturing entirely through the thickness of the grid are obtained, and the monolithic grid is obtained.

In another example, the grid may be formed from a plastic plate where the cells are formed mechanically rather than chemically etched, such as by drilling. For example, when the the grid is not formed from etched silicon, it may be formed with perpendicular sidewalls. If necessary or desired, portions of grid may be coated after the cells are made to provide reflective sidewalls. For example, the grid may be metallized with aluminum or another metal to provide the reflective sidewalls. Alternating layers of materials of varying refractive index, i.e., distributed bragg reflectors (DBR), may also be disposed in the cells to provide reflective sidewalls. The production of the grid in these various ways provides a cost-effective way to ensure optical performance for an array of LEDs.

The finished grid is placed and fixed on the populated printed circuit board or other substrate. The die array on which the grid is fixed is produced separately before or after formation of the grid. The die may be attached to the substrate by pick and place die attach methods. The die array may be electrically connected through the printed circuit board in either single pixel, row, column, or arbitrary group addressability. For example, each of the die 610 may be individually addressable. Additionally or alternatively, the die may be addressable in strings, i.e., addressable as columns or rows of the array. The die can be any color, depending on the desired output (e.g., projection image) from the array, and can have reflective optical side-coats to ensure maximum top emission. For example, each of the die may be white LED chips. Alternatively, they can be blue LED chips used in conjunction with phosphors disposed in the grid cells 615 to produce white light.

After the grid is placed and fixed on the substrate, such that one die is located in each of the cells in the grid, a phosphor integration technique can be used to apply wavelength converting phosphor materials to LEDs in the array after the grid is placed. For example, phosphor material may be dispensed into individual cells in the grid one-by-one, or by flooding the array, film lamination, blade coating, or electrophoretic deposition (EFD). The phosphor layer that results may fill the cell to be flush with a top of the grid sidewalls and/or the top of any reflective sidewalls disposed in the grid, to cover edges of the grid walls opposite the substrate. Alternatively, the phosphor may only partially fill the cell of a grid to have a top surface below the grid top surface. Individual (e.g., silicone) lenses may be placed on top of each pixel in the array to act, for example, as integrated collimating lenses/pre-optics to couple light from the LED array into subsequent optical elements in a device. If desired, the resulting LED array may be singulated, e.g. after phosphor curing, to form smaller LED arrays.

Figure 7A:
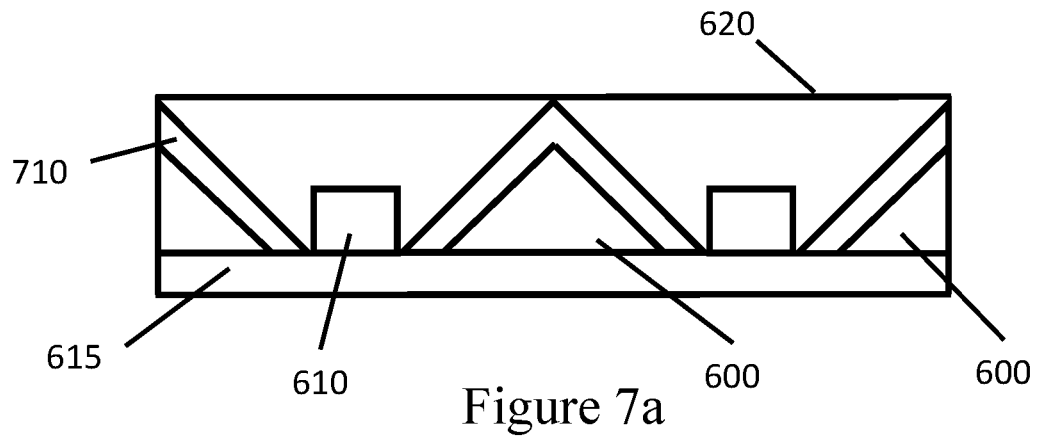
FIGS. 7a-7c illustrate the LED array with a monolithic grid having oblique sidewalls.
Figure 7B:
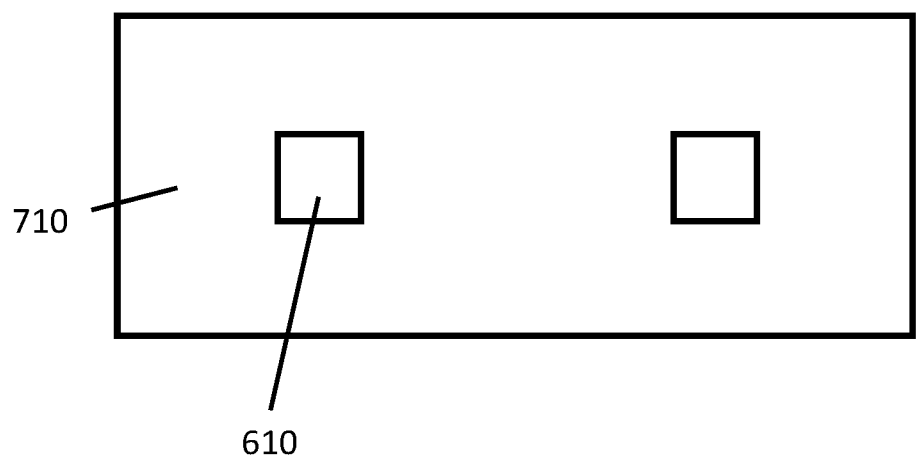
Figure 7C:
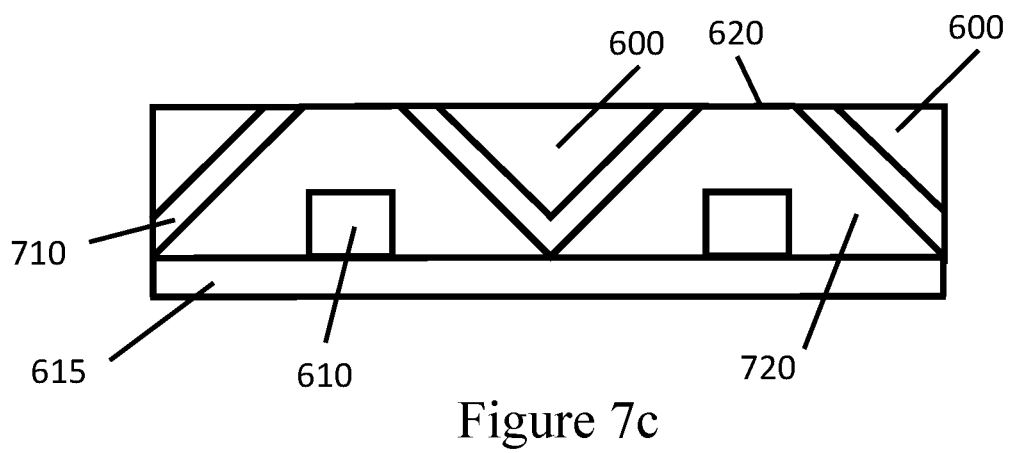

FIGS. 7a-7c show the grid with non-perpendicular sidewalls and optional phosphor layer 720. The sidewalls may be the sidewalls of the grid 600 itself, or it may be reflective sidewalls 710 of DBR or metal different from the grid material, which has been formed on the grid. FIG. 7a illustrates a cross-sectional view of the oblique sidewalls oriented to make the top of the cell 620 wider than the bottom of the cell 620 (which is flush with the bottom of the die 610). In this orientation the light from the die, particularly the light incident on the grid sidewalls, is directed upwards to increase light extraction. The angle of the sidewall may be from 50-60°, e.g., 54.7° with respect to the top of the phosphor layer 720. FIG. 7a illustrates that there is an apex formed by the grid sidewalls or the reflective sidewalls 710 between cells 620. Alternatively, the top the grid surface between adjacent cells 620 may be flat and parallel to the plane of the substrate rather than pointed. FIG. 7b shows a plan view of the device in FIG. 7a, looking at the top light emitting surface of the die 610. FIG. 7c shows a cross-sectional view of an array with the oblique sidewalls oriented to provide a narrower top opening of the cell 620 than the wider bottom opening of the cell 620 flush with the bottom of the die 610. In this case, the grid may have been etched with the wider "bottom" facing towards the mask, then after etching and/or the forming of optional reflective sidewalls, inverted to have that wider bottom facing towards the substrate 615. Here the light emission area, as the top of the cell, is narrower than the bottom of the cell. This narrower top opening allows control of the light emission area based on design requirements. If reflective sidewalls are formed in the cells 620 after etching the cells to form the grid, then they may be arranged not to completely cover the top of the grid 600 (opposite the substrate) after it is disposed on the substrate of the LED array.

The height of the grid 600 (including or without the sidewalls 710 disposed on the grid) may be greater than that of the die 610. Alternatively, the die may have the same height as the grid so that the top surface of the die may be flush with the top surface of the grid.

Figure 9:
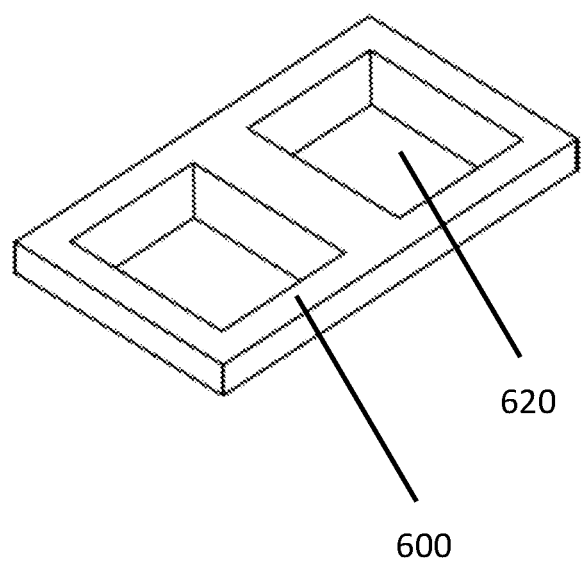
FIG. 9 illustrates a rectangular 2×1 grid that is not square.

FIG. 9 depicts an 2×1 grid. The grid may be silicon made via wet etch. The grid may be rectangular but non-square and may have been made from a larger and/or square array that was then singulated to provide the 2×1 grid. This grid may have oblique or vertical sidewalls and a flat top surface of the grid 600 surrounding the cells 620.

Figure 10:
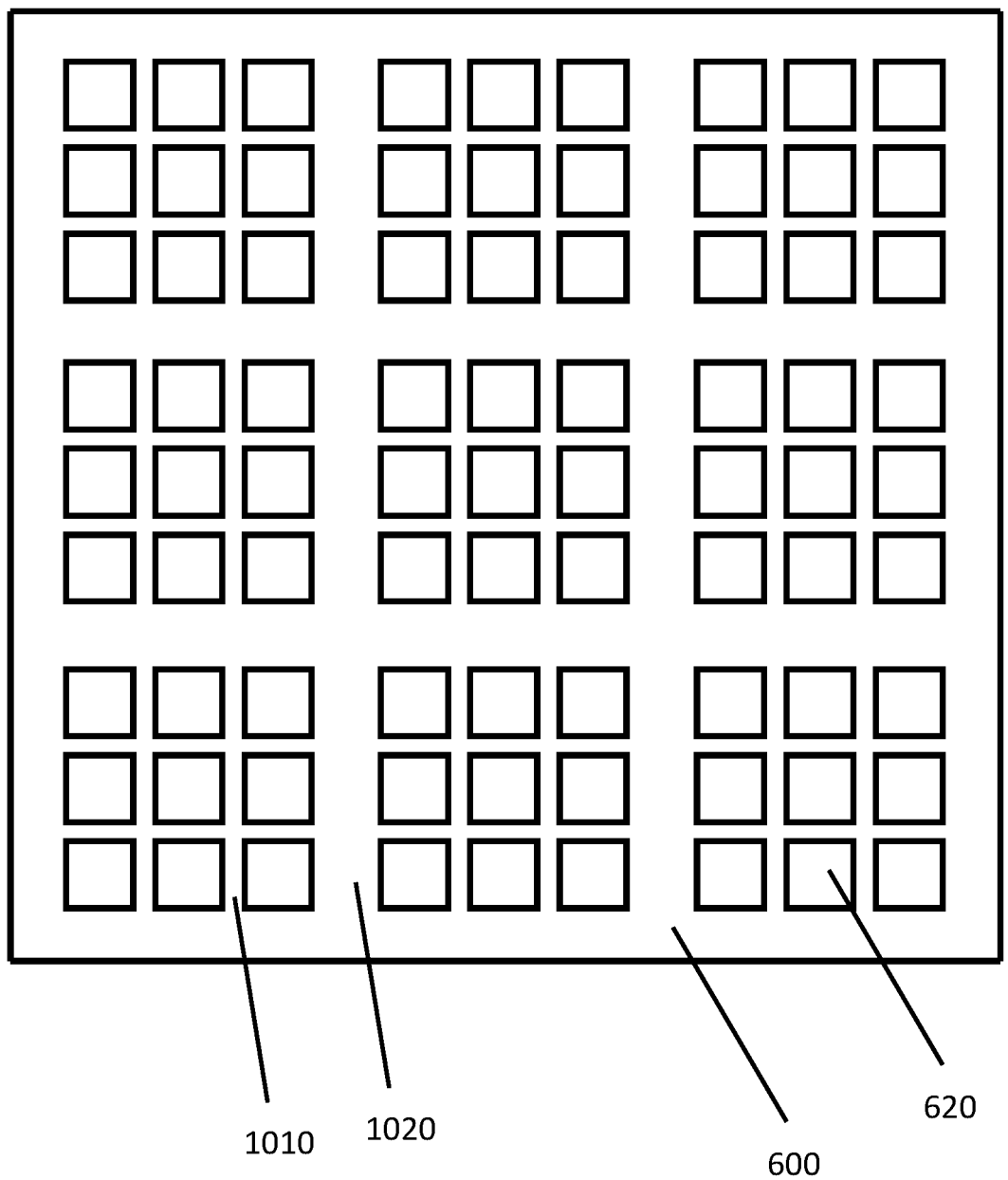
FIG. 10 illustrates a top view of a grid made to accommodate a number of different arrays rather than a single array.

FIG. 10 depicts a grid that may not only optically isolate LED dies within an array from each other, but may optically isolate multiple arrays of LEDs from each other. The grid depicted may be disposed over nine separate arrays, although any number of arrays may be accommodated. The walls 1020 between adjacent arrays and/or at the borders of the grid may be thicker than the walls 1010 between individual LED die within an array.

Figure 11:
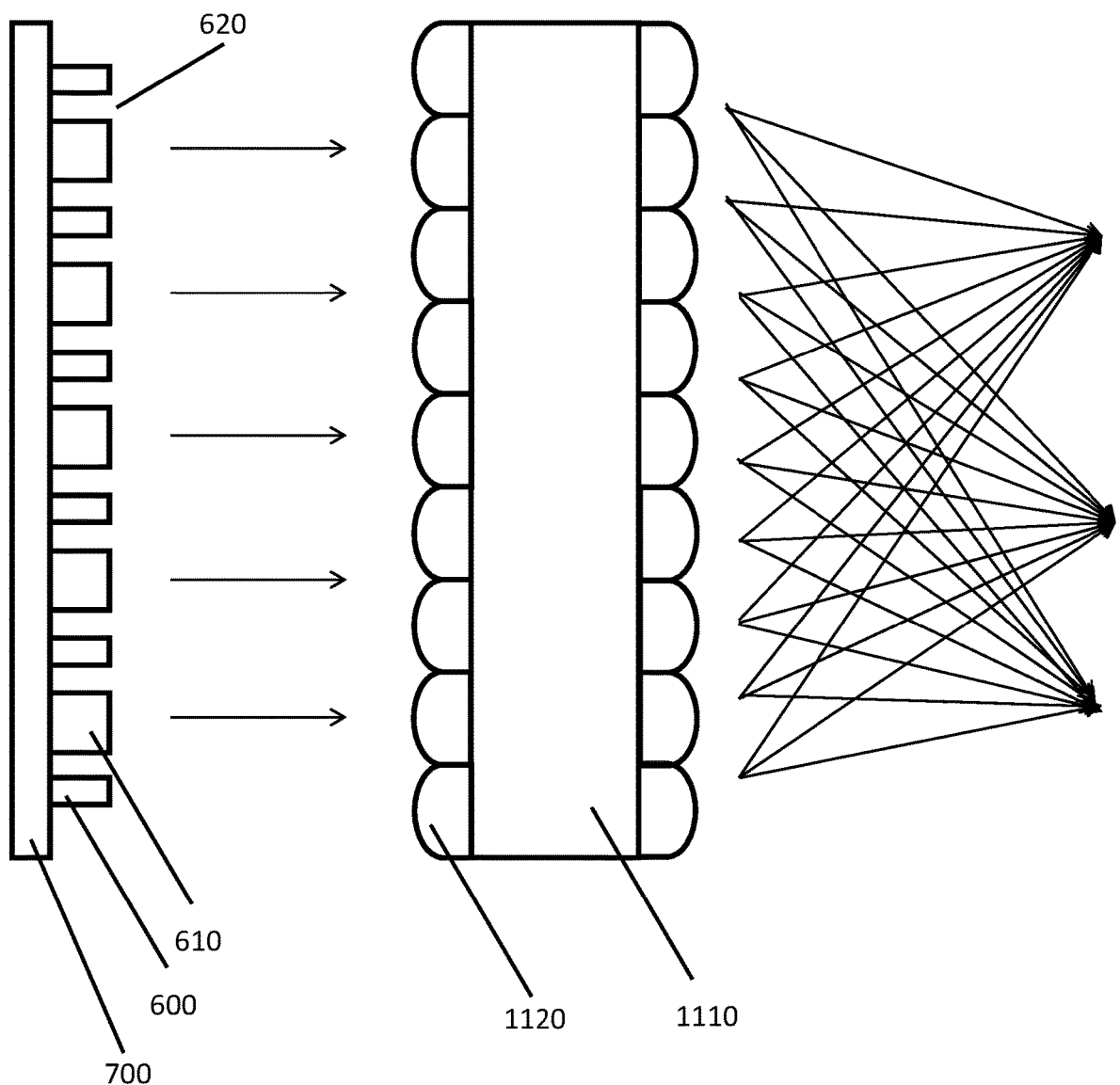
FIG. 11 illustrates a light emitting array with lens disposed over the LEDs to direct the light emitted.

FIG. 11 depicts a light emitting array with an array of die 610 disposed on the substrate 615 and a grid 600 disposed on the substrate. A microlens array 1110 is disposed over the LEDs. FIG. 11 illustrates the die emitting light as shown by the arrows into the microlens array 1110, which directs light of different colors to different points. The microlens array may have one lens 1120 corresponding to each die. Alternatively, the microlens array may have a different number of lens than the number of dies in the array.

This disclosure is illustrative and not limiting. Further modifications will be apparent to one skilled in the art in light of this disclosure and are intended to fall within the scope of the appended claims.

The invention claimed is:

1. A method for making a light emitting diode array, the method comprising:
    forming a monolithic grid defining a plurality of cells;
    providing an array of light emitting diodes (LEDs) on a substrate separate from the monolithic grid, at least some of the LEDs electrically connected to each other in group addressability;
    disposing the monolithic grid on the substrate so that each of the cells surrounds a corresponding one of the LEDs to form an optically isolated array of LEDs; and
    singulating the optically isolated array of LEDs.

2. The method of claim 1, wherein the monolithic grid is or comprises silicon.

3. The method of claim 2, further comprising providing a silicon wafer;
    wherein the forming a monolithic grid comprises wet etching or dry etching the silicon wafer to form the cells.

4. The method of claim 1, wherein the monolithic grid is or comprises a resin.

5. The method of claim 4, wherein the resin is silicone.

6. The method of claim 1, further comprising providing a plastic wafer;
    wherein the forming a monolithic grid comprises drilling the plastic wafer to form the cells.

7. The method of claim 1, further comprising metallizing the cells of the monolithic grid to form reflective sidewalls.

8. The method of claim 1, further comprising disposing Distributed Bragg Reflectors (DBR) in the cells of the monolithic grid to form reflective sidewalls.

9. The method of claim 1, wherein the substrate is a printed circuit board, and providing the array of light emitting diodes on the substrate comprises disposing the LEDs on the substrate by pick and place.

10. A light emitting diode device comprising:
    a substrate comprising a first surface;
    an array of light emitting diodes (LEDs) each comprising a light emitting surface, the array disposed on the first surface of the substrate;
    a monolithic grid comprising resin disposed on the substrate and defining a plurality of cells in which corresponding ones of the light emitting diodes are disposed with their light emitting surfaces facing in a same direction out of the monolithic grid, the cells comprising sidewalls of the resin perpendicular to the first surface of the substrate and spaced apart from the LEDs; and
    phosphor disposed in direct contact with the light emitting surface of the LEDs.

11. The light emitting diode of claim 10, wherein the LEDs are addressable string by string.

12. The light emitting diode of claim 10, wherein the array is an X by X array, with X being from 5 to 15.

13. The light emitting diode of claim 10, wherein the monolithic grid comprises silicon.

14. The light emitting diode of claim 10, further comprising distributed bragg reflector (DBR) disposed on the sidewalls of the resin.

15. The light emitting diode of claim 10, wherein the resin is silicone.

16. The light emitting diode of claim 10, further comprising a microlens array disposed over the array of LEDs and comprising a lens for each of the LEDs in the array of LEDs.

17. The light emitting diode of claim 10, wherein the plurality of cells form a plurality of cell arrays, the cells within a cell array are separated from adjacent cells by first walls comprising the sidewalls and having a first thickness, and the cell arrays are separated from adjacent cell arrays by second walls having a second thickness greater than the first thickness.

18. The light emitting diode of claim 10, further comprising reflective side walls disposed in the cells of the monolithic grid and comprising a metal that is a different material than the monolithic grid.

19. A method for making a light emitting diode array, the method comprising:

forming a monolithic grid comprising resin defining a plurality of cells, the cells comprising sidewalls of the resin;

providing an array of light emitting diodes (LEDs) on a substrate separate from the monolithic grid, the LEDs disposed on a first surface of the substrate;

disposing the monolithic grid on the substrate so that each of the cells surrounds a corresponding one of the LEDs and the sidewalls of the resin are perpendicular to the first surface of the substrate and spaced apart from the LEDs; and dispensing phosphor into the cells to be in direct contact with the light emitting surface of the LEDs.

20. The light emitting diode of claim 10, wherein each of the LEDs are discrete die and the substrate is a printed circuit board.

* * * * *